(12) United States Patent
Borg et al.

(10) Patent No.: US 6,476,864 B1
(45) Date of Patent: Nov. 5, 2002

(54) PIXEL SENSOR COLUMN AMPLIFIER ARCHITECTURE

(75) Inventors: Matthew M. Borg, Corvallis, OR (US); Charles E. Moore, Loveland, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/076,014

(22) Filed: May 11, 1998

(51) Int. Cl.[7] ............................... H04N 9/64
(52) U.S. Cl. .................... 348/245; 348/241; 348/304; 348/308
(58) Field of Search .................. 348/241, 243, 348/245, 302, 304, 308, 281; 378/98.8; 250/208.1

(56) References Cited

U.S. PATENT DOCUMENTS

| | | | |
|---|---|---|---|
| 4,283,742 A | 8/1981 | Izumita et al. | 358/213 |
| 4,845,382 A | 7/1989 | Eouzan et al. | 307/353 |
| 5,216,509 A | 6/1993 | Hirasawa | 358/213.15 |
| 5,434,619 A | 7/1995 | Yonemoto | 348/241 |
| 5,471,515 A | 11/1995 | Fossum et al. | 377/60 |
| 5,515,046 A | 5/1996 | Mandl | 341/143 |
| 5,572,155 A | 11/1996 | Tamayama | 327/94 |
| 5,631,704 A | 5/1997 | Dickinson et al. | 348/308 |
| 5,721,425 A | 2/1998 | Merrill | 250/214.1 |
| 5,965,871 A | * 10/1999 | Zhou et al. | 250/208.1 |
| 5,969,758 A | * 10/1999 | Sauer et al. | 348/241 |
| 6,018,364 A | * 1/2000 | Mangelsdorf | 348/241 |
| 6,166,768 A | * 12/2000 | Fossum et al. | 348/308 |

OTHER PUBLICATIONS

Mendis, Sunetra, et al., "Design of a Low–Light–Level Imate Sensor with On–Chip Sigma–Delta Analog–to–Digital Conversion"SPIE vol. 1900, 0–8194–1133–7193, pp. 31–39.

Hoekstra, William, et al., "A memory read–out approach for a 0.5μm CMOS image sensor", SPIE vol. 3301, 0277–786X/98, pp. 151–157.

Eric R. Fossum, "Active Pixel Sensors: Are CCD's Dinosaurs?", SPIE vol. 1900, 0–8194–1133–7193, pp. 2–14.

* cited by examiner

*Primary Examiner*—Wendy R. Garber
*Assistant Examiner*—Jason Whipkey

(57) ABSTRACT

A pixel column amplifier architecture creates a reduced noise differential image signal from an pixel sensor array. The pixel column amplifier architecture comprises a first double sampling (DS) circuit and a second DS circuit that has the same configuration as the first DS circuit. An image signal containing a combination of noise components created on a substrate is coupled to the first DS circuit. A reference image signal, held in a reset state, represents the noise component of the image signal and is coupled to the second DS circuit. Further, a reference voltage source is coupled to a reference input of both the first DS and the second DS circuits. The first DS circuit provides the first side of the differential image signal, and the second DS circuit provides the second side of the differential image signal.

16 Claims, 9 Drawing Sheets

PIXEL SENSOR COLUMN AMPLIFIER ARCHITECTURE

BACKGROUND OF THE INVENTION

This invention generally relates to solid-state imaging devices and, more particularly, to an active pixel sensor column amplifier architecture in which fixed panel noise and other noise sources can be removed from an image signal generated by a set of pixels on the solid-state imaging device.

Past electronic cameras used charge coupled device (CCD) imagers to convert optical images into corresponding electronic signals. A typical CCD imager includes a matrix of photosites (an array) that are capable of collecting free electrons that form an electrical charge packet that is directly proportional to the photon radiation incident at that photosite. Accordingly, when an image is focused on the surface of the array, the charge packet at each photosite of the array corresponds to a respective picture element or pixel of the complete image. The generated photosite charge packets are transferred in a parallel manner into a CCD shift register where they are transferred serially as an output signal of the CCD image. The CCD imager output signal is a series of electronic signals whose amplitude represent the light intensity of the image at each pixel for a single image frame. The process is continuously repeated to generate output signals, which correspond to several image frames per second. Consequently, each frame in the generated output signal contains information concerning the detected light intensity at each photosite.

A drawback of typical CCD imagers is that they require near-perfect charge transfer over a distance of approximately 1–2 centimeters through semiconductor materials. Therefore, such CCD imagers require a substantial amount of power, are difficult to manufacture in large array sizes, and are difficult to integrate with complementary metal oxide semiconductor (CMOS) on chip electronics. The difficulty is that the standard CCD process is incompatible with CMOS processing, while the imager signal processing electronics required for the imager are best fabricated in CMOS.

Therefore, active pixel sensors (APS) have become increasingly popular as an alternative to CCD imagers in camera equipment. APS employ one or more on-chip transistors at each pixel photosite in the array. The transistors at the photosite buffer a photo signal corresponding to the charge packet generated by the photosite and drive an output signal line avoiding the disadvantages of the CCD imagers that have to serially shift the data out. However, typical APS arrays still generate an output signal with each frame (representing a row of image data in the array) containing information representing the detected light intensity at each photosite.

The traditional method for storing and buffering the outputs (see U.S. Pat. No. 5,471,515) of a row of pixels in an APS array is to individually store the image signal (that is integrated over an exposure time) and a reset level on two capacitors. The two capacitors are connected between some reference (such as ground (GND)) and the gates of a pair of source follower amplifiers. The outputs of the two source followers then provide a quasi-correlated double sampled difference image signal proportional to the integrated light that can be further buffered, amplified or digitized. However, this traditional method has several problems.

One problem is that a non-uniform background image will result due to fixed pattern noise (FPN). This FPN noise appears as a random streaking appearing on a blank display. This effect is due to process induced mismatches because the pair of source follower amplifiers, while schematically identical, will have different offset voltages which result in a random offset (for each column) in the output difference signal. This noise is bad in that it is inherent in the design and manufacture of the APS array, thus varying from part to part. It cannot be removed without additional complicated circuitry that uses scarce integrated circuit real estate, thus increasing the cost of an integrated image sensor.

A second problem is that the resolution of the image from the APS array is not sharp enough as required by the increased consumer demands for quality vibrant images. This effect is due to the source follower amps having less than unity gain, which reduces the sensitivity, and thus the available signal to noise ratio (S/N) of the signal. Thus, any noise added after the voltage follower will appear larger relative to the actual image. This effect is especially noticeable in low light conditions. Most people who have used a video camera are familiar with this problem. Users do not want to use flashes or photo lamps due to their cost, power requirements, obnoxiousness, and general clumsiness of setup. User demands thus require the ability to get high quality photos in all lighting conditions, including low light situations. Therefore, a need to reduce the noise and/or increase the image signal on the APS array is needed.

A third problem sometimes noticed with certain images is that the picture appears distorted. This distortion is due to the non-linearity of the source follower amplifiers inherent in their design. Because there is no feedback in the source follower amplifier, the non-linearity cannot be corrected. The user demands that a camera always present a clear undistorted image to preserve accurately those treasured memories they wish to keep.

A less severe fourth problem is that some APS arrays present an image that has a snowy noise effect even in well-lit conditions. This noise condition can arise because the source follower amplifiers consume a lot of power and therefore are turned off when that particular column of the APS array is not being accessed. When the source follower amps are turned on to sample a column, extra charge from the switching circuit introduces this noise onto the signal. Another way this noise is introduced is due to common mode noise on each source follower amplifier (from the power supply, substrate, or other switching circuits) which is coupled onto the image signal. Because the common mode noise frequency is usually independent from the rate at which the image is being sampled from the APS array, the noise tends to appear random and thus snowy to the user. Again, the users are demanding defect free images and generally will not tolerate this noise.

Some implementations have tried to solve these noise problems by using a darkened column as a reference source of noise which is subtracted from the other photocells columns in the array that are integrating light. However any difference in leakage from the photocell to the substrate, caused by defects in the IC processing, between the reference column photosites and the image column photosites will be an additional noise source for fixed pattern noise (FPN), which the implementations are trying to eliminate.

Some implementations that use a passive pixel site (no buffering or gain transistor is used at photosite 10) use a complex operational transconductance amplifier in the column amplifier to alleviate the problems associated with the voltage follower amplifiers traditionally used. However, in addition to the complexity and large amount of IC real estate required, the gain of the amplifiers are inconsistent across the IC due to variations in the manufacturing process, once again adding a new source of FPN.

What is required to accelerate the market for digital photography is an innovative method of removing noise sources from the image signal without adding substantial cost or manufacturing difficulties, thus providing professional results for ordinary consumers.

SUMMARY OF THE DISCLOSURE

A pixel column amplifier architecture creates a reduced noise differential image signal from an pixel sensor array. The pixel column amplifier architecture comprises a first double sampling (DS) circuit and a second DS circuit that has the same configuration as the first DS circuit. An image signal containing a combination of noise components created on a substrate is coupled to the first DS circuit. A reference image signal, held in a reset state, represents the noise component of the image signal and is coupled to the second DS circuit. Further, a reference voltage source is coupled to a reference input of both the first DS and the second DS circuits. The first DS circuit provides the first side of the differential image signal, and the second DS circuit provides the second side of the differential image signal.

DETAILED DESCRIPTION OF THE PREFERRED EMBODIMENT

Figure 1:
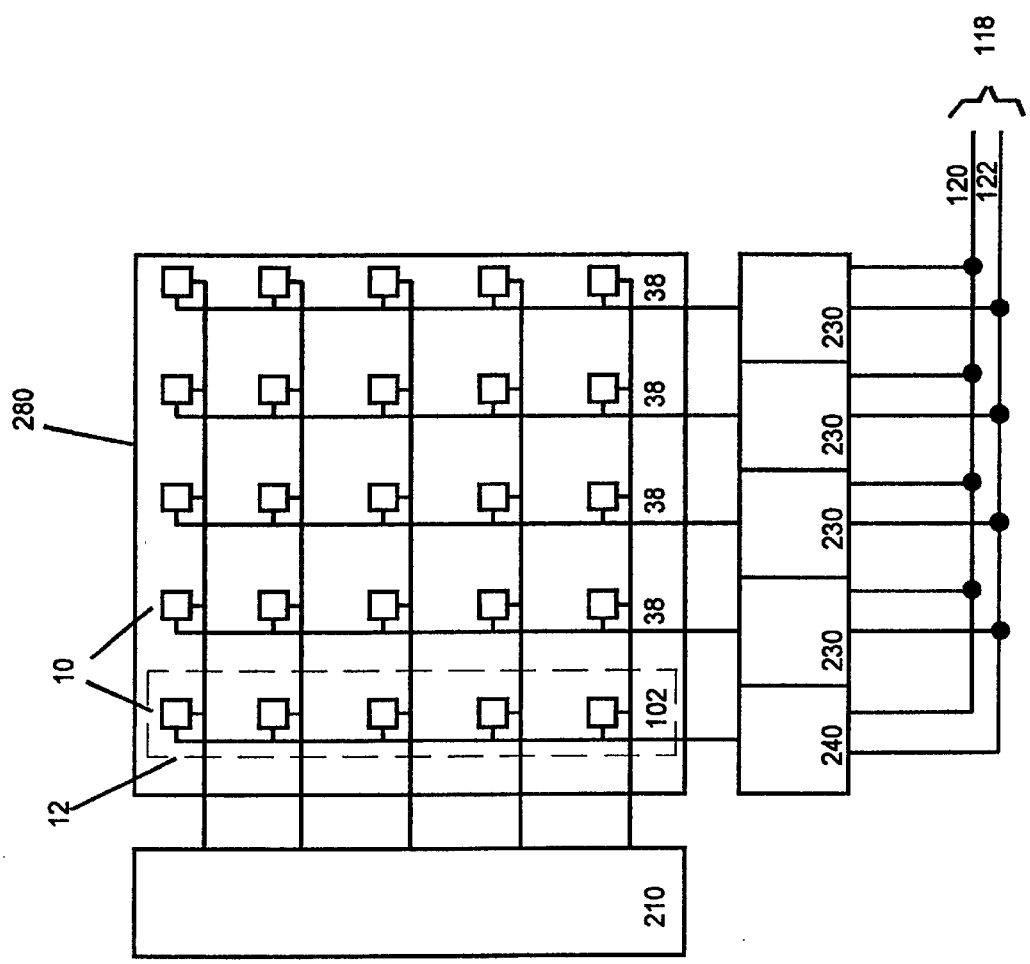
FIG. 1 illustrates a simple block diagram of the preferred embodiment of the invention.

In FIG. 1, the preferred embodiment of the invention produces an equivalent difference image signal 118 and is able to eliminate many of the sources of extraneous noise components introduced onto the image signal created by the active pixel sensor sites (APS) 10. The preferred embodiment adds at least one additional column of pixels (hereinafter called the reference column 102) to an active pixel sensor array 280. This reference column 102 is used to generate one-half of a difference image signal 118, comprised of a first side 120 and a second side 122. The reference column pixels 12 are identical to others in the array except that they use a different reset signal from row decoder 210. Optionally, the reference column pixels 12 may be optically masked to prevent light from striking on them to further reduce noise from being introduced. The reference pixel 12 for a given row, when not being read, is held in a reset state, thus integrating no light. When the reference pixel 12 is selected, the pixel is optionally taken out of reset and the reference column amplifier 240 is driven to a reset pixel level, while all the column amplifiers 230 are driven to a level proportional to the incident light striking that pixel in each column of the selected row. The incident light is integrated over an exposure period to adjust to ambient lighting conditions. During column readout, the reference column amplifier 240 output is always selected to provide one-half (the second side 122) of the difference image signal 118, while the remaining column amplifier 230 outputs are sequentially selected to provide the other one-half (the first side 120) of the difference image signal 118. All of the column amplifiers 230, including the reference column amplifier 240, are identical sample and hold amplifiers utilizing the same control signals, bias voltages, and a reference voltage, Vref. The amplifying element in each column amplifier can be a simple two transistor amplifier or a more complex configuration to provide higher gains with lower power consumption at higher frequencies, thus allowing faster readout rates.

There are three phases of operation for the column amplifiers: phase 1) select a row in the array, sample and store the image signal from each pixel in the selected row coupled to each respective common column line 38 which is coupled to a column amplifier; phase 2) sample and store the reset state of each selected pixel and subtract from each respective stored sampled image signal; phase 3) present the output of each column amplifier 230 output line when selected sequentially to form a row of image data to be processed further by other system electronics on an integrated circuit. A typical set of time intervals for the three phases are: 4 microseconds for phase 1, 4 microseconds for phase 2, and 1 microsecond to several hundred microseconds, depending on the exposure time desired for the image and the number of columns in the array to be read out, for phase 3.

Figures 1A, 1B:
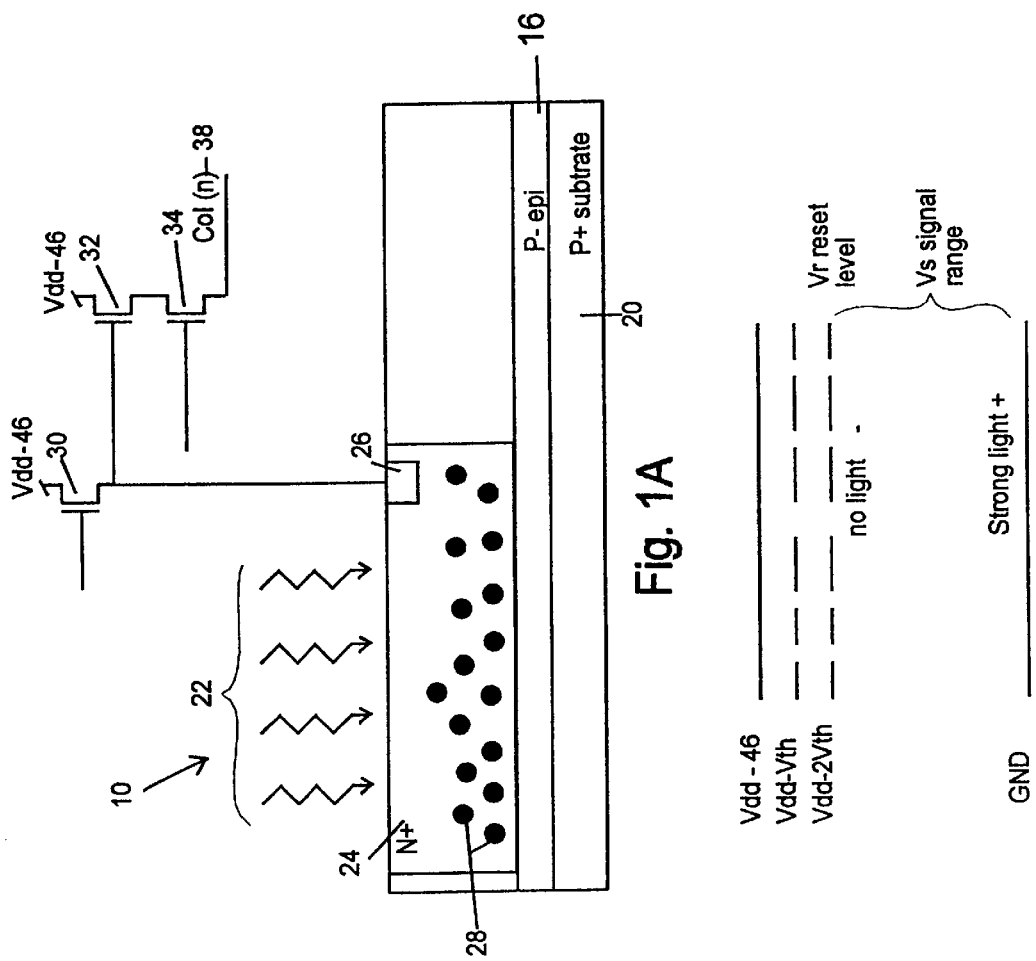
FIG. 1A illustrates an active pixel sensor photosite used in the preferred embodiment of the invention.
FIG. 1B illustrates the image signal operating range used in the preferred embodiment of the invention.

FIG. 1A illustrates one type of an active pixel sensor (APS) site 10, which represents one pixel in the array. This site performs the light to electrical signal transformation. An active pixel sensor array is a matrix of this APS site 10 formed in rows and columns (see FIG. 3A). These APS sites 10 are fabricated on a semiconductor substrate 20, an exemplary type being a P+ substrate shown in FIG. 1A. A photo well 24 is formed in the substrate and is designed to prevent leakage of non-photo generated charge into substrate 20. In FIG. 1A, a thin P– epixial layer 16 (epi) is formed on top of the P+ substrate 20 to further reduce this leakage. The photowell 24, shown in FIG. 1A, is made of an N+ material to form a diffusion node. Those skilled in the art will appreciate that other possible active pixel cell or even passive pixel cell implementations are possible and does not affect the scope and spirit of the invention.

A contact 26 couples the photo well 24 to other circuitry used to control and convert the light source 22 striking the photo well 24. The photo well 24 (a diffusion node) is a reversed biased diode, (commonly known as a photodiode) which includes a parasitic capacitor which can store charge 28, thus creating a voltage potential. This stored charge 28 is supplied from power supply 46 (Vdd) by a reset switch 30, which when activated fills photo well 24 with charge 28. After the reset switch 30 is opened, the light source 22 striking the photo well 24 causes photonic energy from the light source 22 to form a number of electron-hole pairs in both the photowell 24 and the underlying substrate 20. The number of electron-hole pairs is a function of the intensity of the received light energy in light source 22. The holes formed in photowell 24 in turn, diffuse to the junction with the substrate 20 where they are swept into the substrate 20 under the influence of an electric field at the bias junction of photowell 24 and substrate 20. Similarly, the electrons formed in substrate 20 diffuse to the junction of the photowell 24 and substrate 20 where they are swept to photowell 24 and collected at contact 26. Thus, with the addition of each photo-generated electron in photowell 24, the voltage at contact 26 is correspondingly reduced.

Generally, to keep the fill factor (the ratio of the area of the photo well 24 to of the APS site 10 area, i.e. photo well 24 area/APS site 10 area) as large as possible, the reset switch 30, buffer 32, and row select switch 34 are fabricated preferably as NMOS FET devices. This fact requires that the gate of each transistor be at least one threshold higher than the source of the transistor to turn on the transistor. Thus, the maximum voltage potential that the photo well 24 will be charged to is one gate threshold (the magnitude of which is determined by the IC process used, typically 0.8V to 1.2V) less than the voltage present on the gate of reset switch 30, an exemplary value being power supply voltage 46, VDD. Likewise, the voltage follower style buffer 32 will cause its source to be one gate threshold below the signal on its gate. Therefore, the maximum signal that the common column line 38 sees is the power supply voltage 46 (Vdd) less two gate threshold voltages, as seen in FIG. 1B. Also, this maximum signal represents when there is no light source 22 striking the photo well. As light source 22 strikes the photo well, the signal level shown on the common column line 38 will decrease at a rate proportional to the light intensity of light source 22, to voltage potential ground (GND) on a maximum intensity light source 22.

Noise can be introduced into the image signal from a number of sources such as 1/f noise and threshold FPN. One source of 1/f (sometimes called flicker noise) noise is introduced when the photo well 24 is reset. This noise comes about due to the gate threshold varying due to extra electron states at the silicon to silicon dioxide boundary under the gate of the reset transistor 30. Another source of noise is introduced from the substrate 20. Noise can also be introduced by differences in the thresholds of buffer 32, and from the power supply 46, Vdd.

Other problems that need to be addressed are: how to increase the gain of the signal to reduce the signal to noise (S/N); how to transmit the image signal across an IC to an A/D decoder or other processing circuitry without picking up stray noise as it crosses other signals; and how to level shift the signal in order to keep it within the usable voltage parameters of the circuits used.

Figure 2:
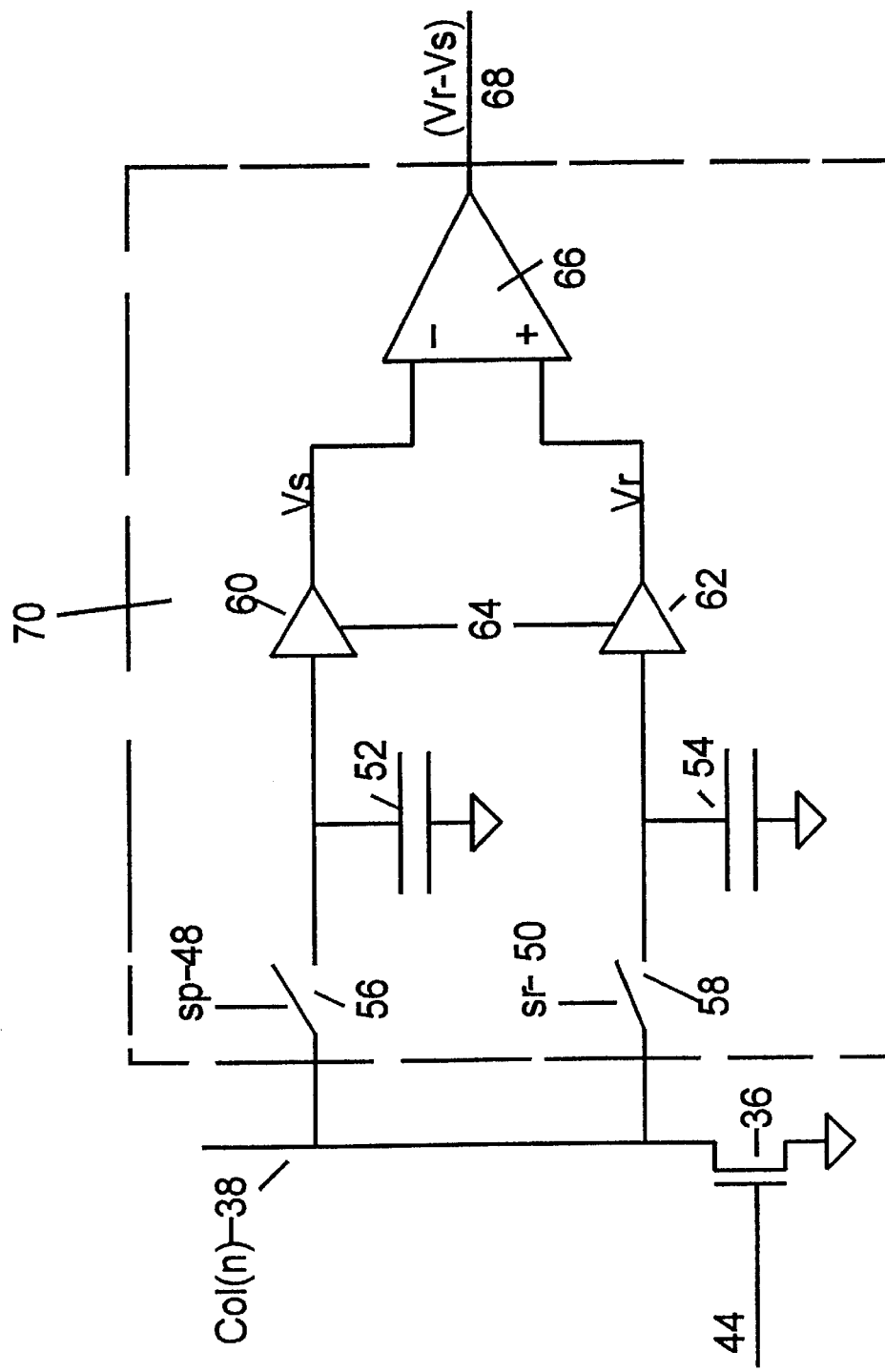
FIG. 2 shows a prior art column amplifier comprising a double sampling circuit used to reduce noise sources having low frequency components.

It is known that to reduce low frequency noise components such as 1/f noise and threshold fixed pattern noise (FPN), a double sampling circuit such as that shown in FIG. 2 can be used. In this circuit, common column line 38 transfers the signal to prior art column amp 70 in three phases. The column line 38 first presents the image signal and pixel switch 56 is closed due to pixel select signal 48 being activated. At the end of the first phase, the pixel switch 56 is opened and the charge stored on pixel capacitor 52 holds the image signal level. During the second phase, the reset select signal 50 closes the reset switch 58 and then the pixel photowell is reset. At the end of the second phase, a signal (Vr) representing the reset (no light) state of the pixel well is present on reset storage capacitor 54 and reset switch 58 is opened.

During the third phase, the image voltage follower 60 and the reset voltage follower 62 is enabled by enable control 64 and the image signal Vs is subtracted from the reset signal Vr in conventional difference circuit 66 to provide a single ended image signal 68 representing the intensity of the light striking the photo well. Each column line is then selectively sampled to read out an entire row, then the next row is selected and started at the first phase again. The 1/f and threshold FPN noise are reduced due to this double sampling approach. However, other noise present on the image signal Vs or the reset signal Vr is passed through the prior art column amp.

Figure 3A:
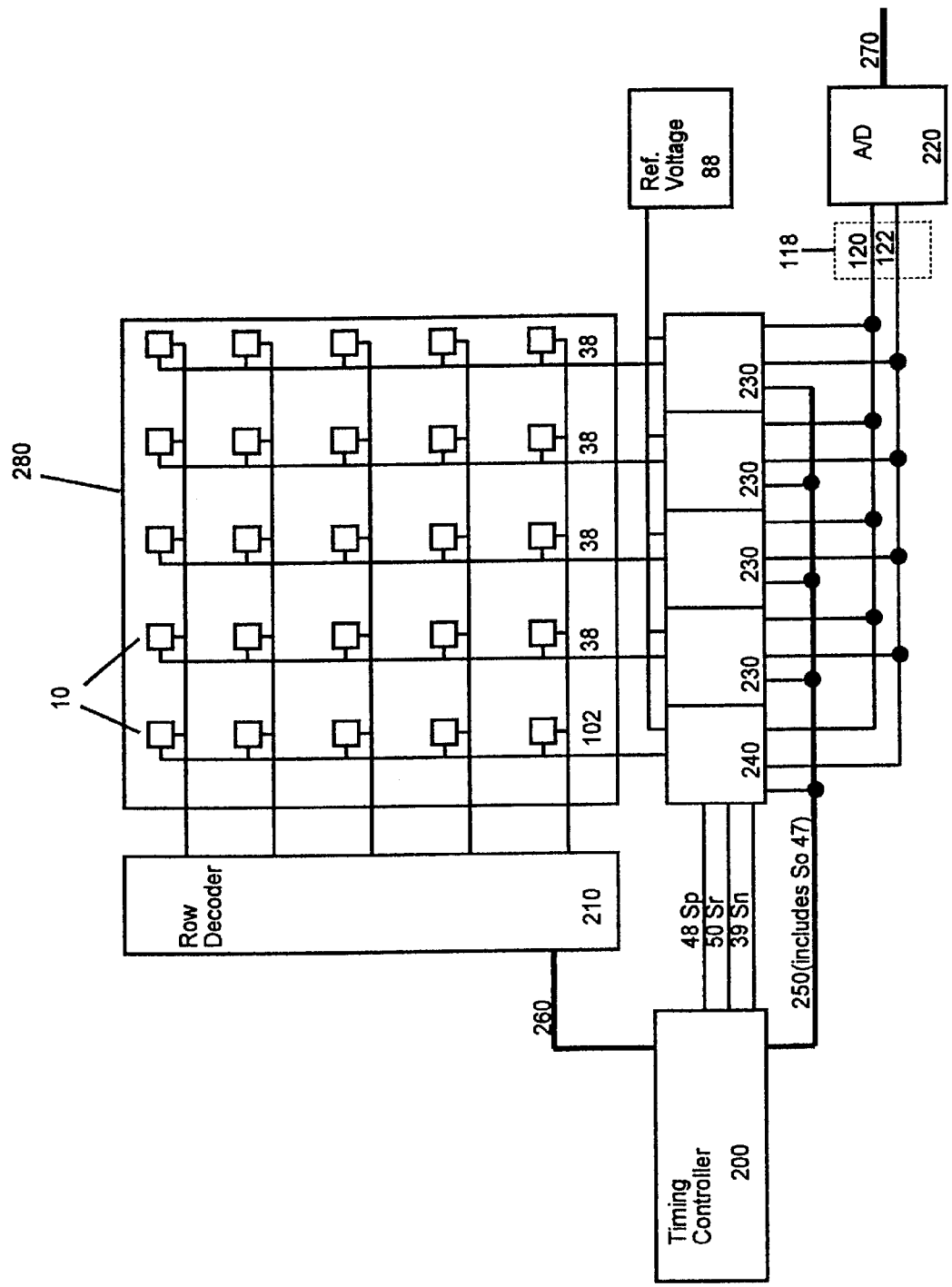
FIG. 3A illustrates a block diagram of an active pixel sensor array, which uses a reference column as in the preferred embodiment, and the additional interface and control blocks.

FIG. 3A illustrates a block diagram of an active pixel sensor array 280 used in the preferred embodiment and its associated circuitry used to control and read out the image that is formed on the array. The array is made up of rows and columns of active pixel sensor sites 10. In this exemplary figure, there are 5 rows and 5 columns. However, those skilled in the art will appreciate that the number of rows and the numbers of columns could be any size and still meet the spirit and scope of the invention. A timing controller 200 is used to select which row and which column to read out of the array through row control signals 260 coupled to row decoder 210. The timing controller 200 also generates the timing for a set of column amplifiers 230 and a reference column amplifier 240, which are each new double sampling circuits (DS) comprised of switched capacitor sample and hold amplifiers. In addition, the timing controller either sequentially selects each column for output or optionally can be programmed to output the columns at different intervals depending on the desired resolution. An example for a half resolution image (from the maximum resolution determined by the number of rows and columns) might be to select every other column and every other row. Each of the column amplifiers 230 and reference column amplifier 240 is coupled to a reference voltage source 88, which is used to level shift the signals exiting the APS array 280 on each common column line 38. Each column amplifier 230 has one output. Each column amplifier 230 provides the first side 120 of a differential image signal 118 representing the ideal image, the reference voltage source 88 and a noise source which represents a combination of noise components. Each column amplifier 230 also provides a dummy load for the second side 122 of the differential image signal 118. The reference column amplifier 240 provides the source for second side 122 of the differential image signal 118 which represents only the voltage reference source 88 and the noise source components, which are in phase and of the same magnitude as with the noise source components on the first side 120 of the differential image signal 118 of each column amplifier 230 output. The reference column amplifier 240 also provides a dummy load output for the first side 120 of the differential image signal 118. The differential image signal 118 is coupled to a differential mode A/D converter 220, which provides a digital output 270.

Figure 3B:
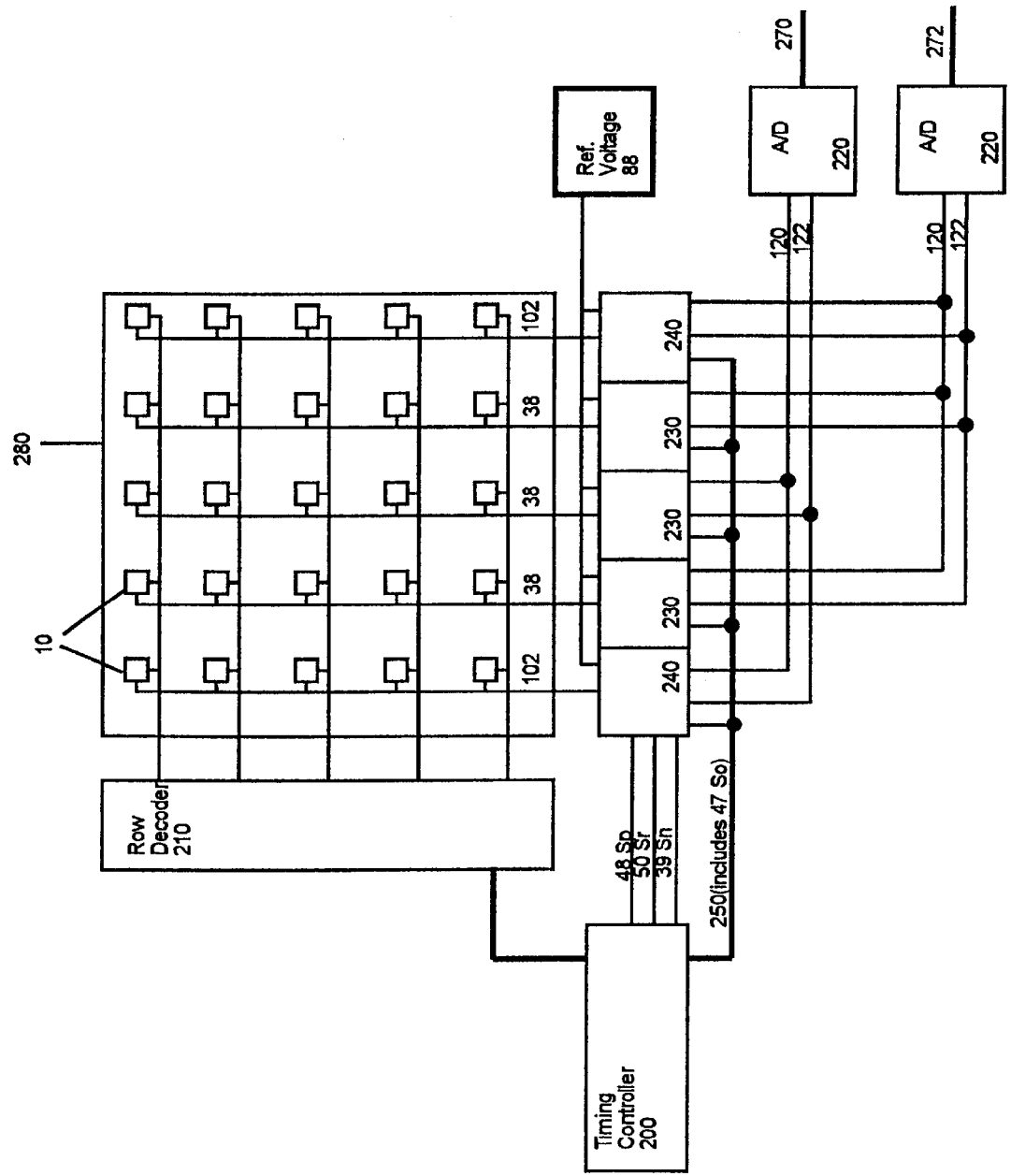
FIG. 3B illustrates another block diagram, which uses multiple reference columns to speed up the read out rate.

FIG. 3B illustrates another block diagram for an active pixel sensor array which uses two reference columns to increase the rate of frame output. In this approach, a column on each side of the array boundary is used to supply the second side 122 of the differential image signal 118, one for the odd columns, the other for the even columns. This approach requires either an additional differential A/D 220 having a digital output 272 or a multiplexer and a single fast differential A/D 220 but for each option, the frame readout is doubled.

Figure 4:
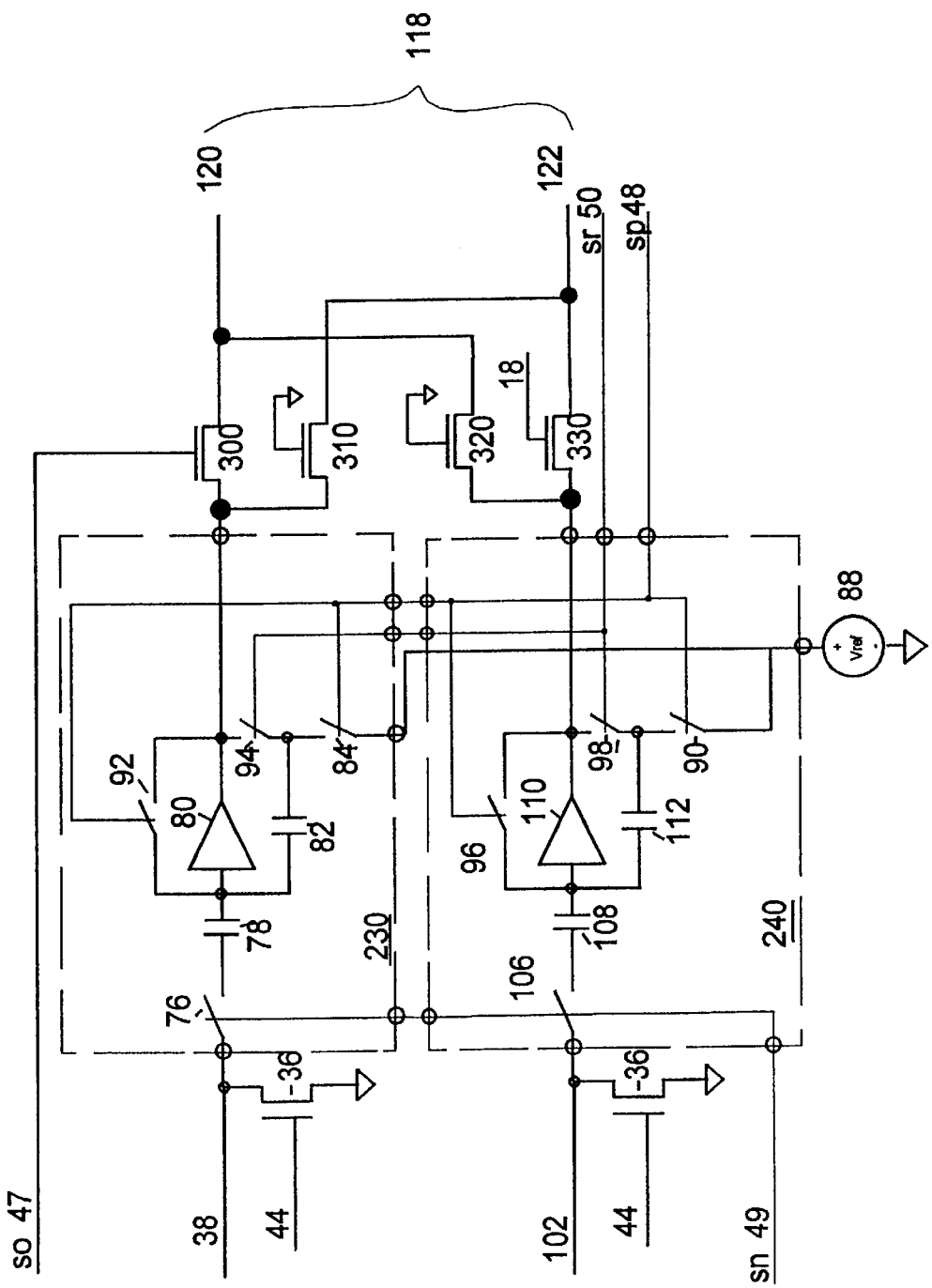
FIG. 4 schematically illustrates the design of the column amplifiers and reference column amplifier used in the preferred embodiment of the invention.

FIG. 4 schematically illustrates the preferred embodiment of the circuitry for the column amplifier 230, using double sampling, and reference column amplifier 240 (which is the same design and layout as column amplifier 230) along with the interfacing used to couple to the differential image signal.

The common column line 38 is biased with a current source comprised of a bias transistor 36 having a bias signal 44 coupled to its gate. The common column line 38 is further coupled to the column amplifier 230 input. Column amplifier 230 comprises a first switch 76 controlled by a Sn signal 49 from timing controller 200. First switch 76 is coupled to a first storage element 78, which in the preferred embodiment is a capacitor. First storage element 78 is further coupled to amplifier 80, second switch 92 and second storage element 82, again a capacitor in the preferred embodiment. The output of amplifier 80 is coupled to the second switch 92, which is controlled by a Sp signal 48, and a third switch 94, which is controlled by a Sr signal 50. The other side of the third switch 94 is coupled to a fourth switch 84, which is also controlled by the Sp signal 48, and second storage element 82. The fourth switch 84 is further coupled to the reference voltage source 88, Vref. The output of the amplifier 80 forms the output of the column amp 230.

Similarly for a reference column amp 240, the reference column line 102 is biased with a current source comprised of a bias transistor 36 having a gate controlled by bias 44. The reference column line 102 is coupled to the reference column amplifier 240 input and is coupled to a first switch 106, controlled by Sn signal 49. This first switch 106 is then coupled to a capacitive first storage element 108. The first storage element 108 is then coupled to the input of an amplifier 110 and to a second switch 96, controlled by the Sp signal 48, and a capacitive second storage element 112. The output of the amplifier 110 is coupled to the second switch 96 and to a third switch 98, controlled by an Sr signal 50. The third switch 98 is coupled to a fourth switch 90, controlled by the Sp signal 48, and to the other end of the second storage element 112. The fourth switch 90 is further coupled to the reference voltage source 88, Vref. The output of amplifier 110 forms the output of the reference column amplifier 240.

In order to maintain the same magnitude and frequency content of noise that is on the reference column portion (second side) 122 of the differential image signal 118 and the noise that is present on the column amplifier portion (first side) 120 of the differential image signal 118, the outputs of the column amplifiers 230 and reference column amplifier(s) 240 need to see the same loading. This balanced loading is achieved by having each column amplifier 230 and reference column amplifier 240 include a dummy load. Having this balanced load enables the noise sources to be essentially the same magnitude so that they can be cancelled in the differential A/D converter 220.

The output of column amplifier 230 is coupled to a first transistor 300 and a second transistor 310, which forms the dummy load for the second side 122 of the differential image signal 118. The first transistor 300 is controlled by the column select signal So 47, which is one of the column select signals 250 (see FIGS. 3A and 3B). The transistor 300 is further coupled to the first side 120 of the differential image signal 118. Second transistor 310 is further coupled to the second side 122 of the differential image signal 118. Second transistor 310 has its gate coupled to GND.

The output of the reference column amplifier 240 is coupled to a third transistor 320 and a fourth transistor 330. The third transistor 320 is used as a dummy load by having its gate coupled to GND. The purpose of the third transistor 320 is to provide an additional balancing load on the first side 120 of the differential image signal 118, thus the third transistor 320 is further coupled to the first side 120 of the differential image signal 118. The fourth transistor 330 is further coupled to the second side 122 of the differential image signal 118. The fourth transistor 330 is enabled when the column outputs are being read by having its gate coupled to a reference column reset signal 18 (see FIG. 6).

Figure 5:
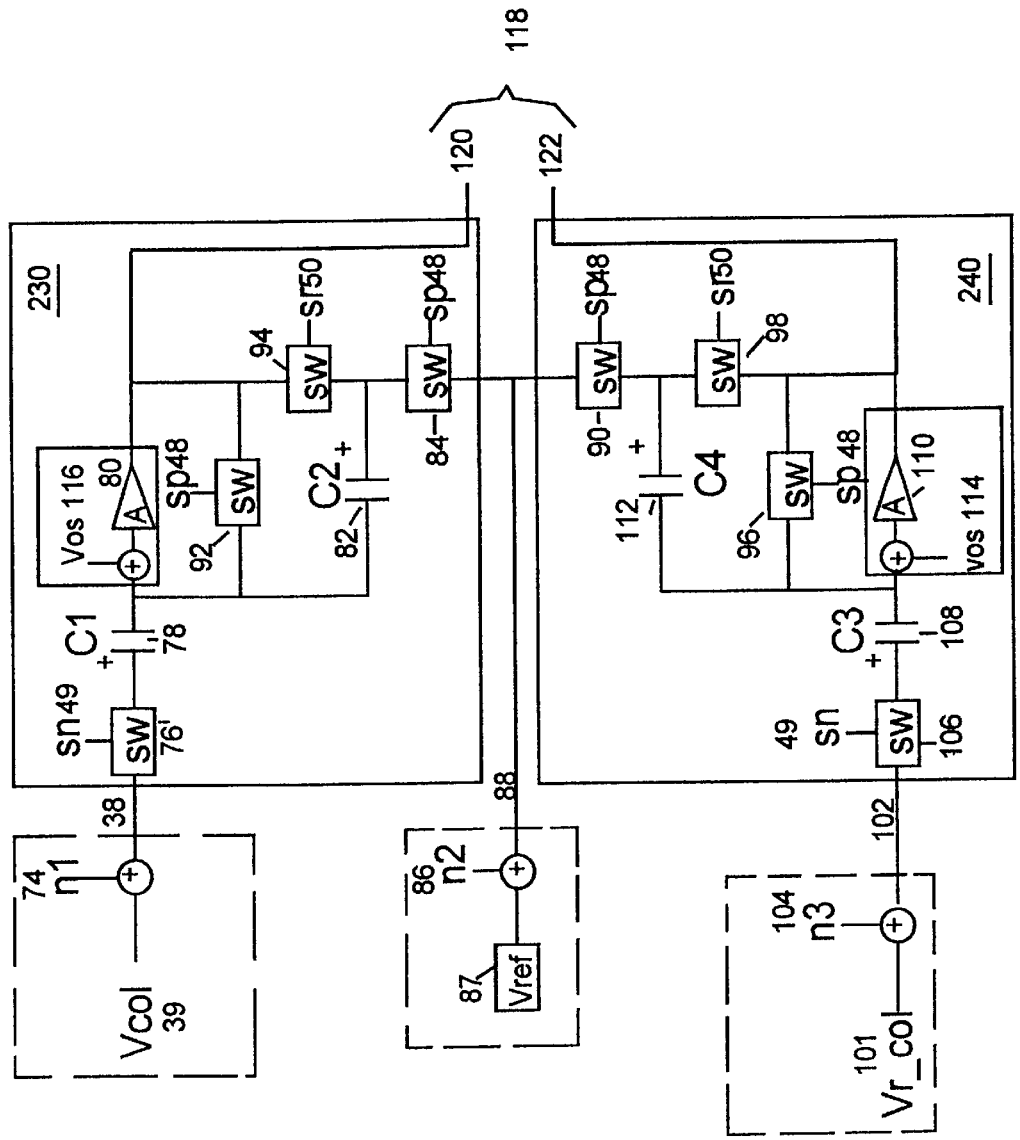
FIG. 5. illustrates the additional noise components and where they are introduced in the preferred embodiment of the invention.

FIG. 5 illustrates the operation and principles of the preferred embodiment of the invention for a single column using the shared reference column amplifier. The common column line 38 is composed of an ideal column out 39 and a first noise component 74 which represents a combination of noise sources which are introduced onto the common column amplifier. The reference voltage source 88, Vref, shared by all column amplifiers, is represented by an ideal voltage reference signal 87 and a second noise component 86. Similarly, the reference column output 102 is represented by an ideal reference column signal 101 and a third noise component 104.

The amplifier circuit in the column amplifier is represented by the amplifier 80 having a voltage offset 116 added to the input signal, representing the unity gain input voltage of the amplifier 80 with an input offset voltage 116. Similarly, for the reference column amplifier 110, voltage offset 114 is added to the input signal.

Figure 6:
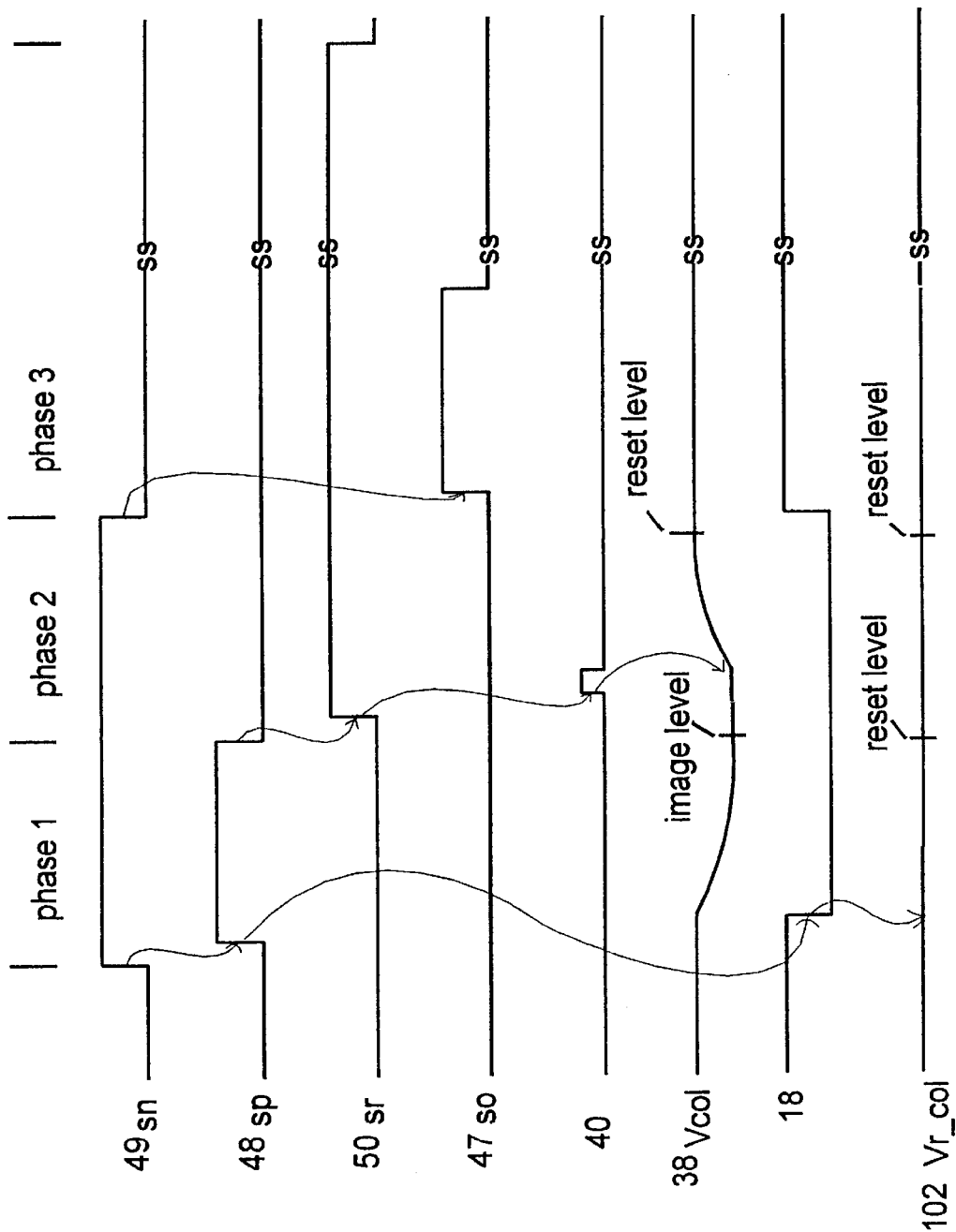
FIG. 6. illustrates the timing used in the preferred embodiment of the invention to control the active pixel sensor photosites and column and reference amplifiers.

FIG. 6 shows the timing used to control the operation of the circuit in FIG. 5. Sn 49 is active during both phase 1 and phase 2, and is used to sample the common column output 38. Sp 48 is active during phase 1 only and is used to sample the pixel image. Sr 50 is active during phase 2 and phase 3 and Sr 50 is used to sample the pixel cell when it is in a reset state and hold the output of the column amplifier during sampling by So 47. So 47 represents that time during the third phase that the difference image signal 118 is sampled for readout of the resultant image signal. At the end of the first phase, a settled image signal from the selected pixel is available with a noise component on the common column output 38. At the end of phase 2, a settled reset level for the selected pixel is available a different noise component on the common column output 38. For the reference column output 102, at the end of phase 1, a settled reset level with a noise component is present. At the end of phase 2, the reference column output has the same reset level but with a different noise component. Column reset signal 40 shows the timing of when a pixel is reset during phase 2. Reference column reset signal 18 illustrates the different reset signal used to reset the reference column pixels. The reference column pixels are held in reset until the pixel in the row selected is selected for readout. During phase 1 and phase 2, the reference column pixel selected to drive the second side 122 of the difference image signal 118, is released from reset to prevent power supply noise from being further coupled into the photocell.

The behavior and operation of the circuit in FIG. 5 can now be analyzed using charge transfer terminology. During the first phase, switch 76 is closed as are switches 92 and 84. Amplifier 80 is shorted from input to output by switch 92 closure causing column amplifier offset voltage 116 to be present. Likewise, switch 84 closure causes the voltage reference source 88 and noise 86 to be placed on storage element 82. The charge at the end of phase 1 on first storage element 78 having a capacity C1 is:

$$Q_{78} = C1(V_{s39} + V_{n74} - V_{os116})$$

where $V_{s39}$ is the ideal image signal, $V_{n74}$ is the common mode noise term from noise source n1 74, and $V_{os116}$ is the offset voltage of amplifier 80. The charge on second storage element 82 having capacity C2 is:

$$Q_{82} = C2(V_{ref87} + V_{n86} - V_{os116})$$

where $V_{ref87}$ is the ideal reference source and $V_{n86}$ is the common mode noise term from noise source n2 86.

Similarly for the reference column amp during phase 1, switch 106, switch 96, and switch 90 are closed and switch 98 is open. The charge on third storage element 108 having a capacity C3 is:

$$Q_{108} = C3(V_{r101} + V_{n104} - V_{os114})$$

where $V_{r101}$ is the noiseless reset level of the reference pixel at the end of phase 1, $V_{n104}$ is the common mode noise present from noise source n3 104 and $V_{os114}$ is the offset voltage of amplifier 110. The charge on fourth storage element 112 having a capacity C4 is:

$$Q_{112} = C4(V_{ref87} + V_{n86} - V_{os114})$$

where $V_{ref87}$ is an ideal voltage reference source and $V_{n86}$ is the common mode noise term from noise source n2 86.

During phase 2, switch 92, switch 84, switch 90 and switch 96 open and switch 98 and switch 94 close. Switch 76 and switch 106 remain closed. The charge on the storage elements at the end of phase 2 are:

$$Q_{78} = C1(V_{r39} + V_{n74}' - V_{os116})$$

where $V_{n74}'$=new noise component, $V_{r39}$=reset level of selected pixel.

$$Q_{82} = C2(V_{out80} - V_{os116})$$

where $V_{out80}$ is the output of column amp 80.

$$Q_{108} = C3(V_{r101}' + V_{n104}' - V_{os114})$$

where $V_{out104}'$=new noise component, $V_{r101}'$=reset level of reference pixel.

$$Q_{122} = C4(V_{out110} - V_{os114})$$

where $V_{out110}$ is the output of reference column amp 110.

Since column amp 80 and reference column amp 110 are fabricated with high impedance inputs such as those found on MOSFET gates, minimal charge is transferred into the input of the amplifier, therefore any charge difference on first storage element 78 must be transferred to second storage element 82 from phase 1 to phase 2. The same charge transfer restriction is true between third storage element 108 and the fourth storage element 112. Therefore, let $\Delta Q_{78}$= charge difference between phase 1 and phase 2 on first storage element 78, then:

$$\Delta Q_{78} = C1(V_{s39} + V_{n74} - V_{os116} - V_{r39} - V_{n74}' + V_{os116})$$
$$= C1(V_{s39} - V_{r39} + V_{n74} - V_{n74}')$$

likewise:

$$\Delta Q_{82} = C2(V_{ref87} + V_{n86} - V_{os116} - V_{out80} + V_{os116})$$
$$= C2(V_{ref87} - V_{out80} + V_{n86})$$

$$\Delta Q_{108} = C3(V_{r101} + V_{n104} - V_{os114} - V_{r101}' - V_{n104}' + V_{os114})$$
$$= C3(V_{r101} - V_{r101}' + V_{n104} - V_{n104}')$$

$$\Delta Q_{112} = C4(V_{ref87} + V_{n86} - V_{os114} - V_{out110} + V_{os114})$$
$$= C4(V_{ref87} - V_{out110} + V_{n86})$$

For charge conservation:

$$\Delta Q_{78} = \Delta Q_{82}$$

$$\Delta Q_{108} = \Delta Q_{112}$$

therefore:

$$C1(V_{s39} - V_{r39} + V_{n74} - V_{n74}') = C2(V_{ref87} - V_{out80} + V_{n86})$$

Solving for $V_{out80}$:

$$V_{out80} = V_{ref87} + V_{n86} - C1/C2(V_{s39} - V_{r39} + V_{n74} - V_{n74}')$$

Similarly for the reference column amplifier 240;

$$C3(V_{r101} - V_{r101}' + V_{n104} - V_{n104}') = C4(V_{ref87} - V_{out110} + V_{n86})$$

Solving for $V_{out110}$:

$$V_{out110} = V_{ref87} + V_{n86} - C3/C4(V_{r101}' + V_{n104}')$$

By letting C3/C4=C1/C2, $V_{n104}=V_{n74}$, and $V_{n104}'=V_{n74}'$ which is possible since the layout of the reference column amplifier 240 is identical to the layout of column amplifiers 230 and the reference column shares the same bulk substrate as the columns in the APS array, and letting $V_{r101}=V_{r101}'$ because the state of the reference pixel is unchanged, then:

$$V_{out110} = V_{ref87} + V_{n86} - C1/C2(V_{n74} - V_{n74}')$$

The difference image signal is then:

$$V_{out80} - V_{out110} = C1/C2(V_{r39} - V_{s39})$$

This result is the same as the prior art amplifier in FIG. 2 (with C1/C2=1) except that most common mode noise sources which would be present on the prior art output are essentially removed from the preferred embodiment of the invention. Notably, gain can be added to the signal by adjusting the capacity C1 of storage element 78 and the capacity C2 of storage element 82 (and likewise, also capacities C3 and C4, holding C1/C2=C3/C4). The gain of the column amplifier is set by the ratio of C1 to C2. Since these two storage elements are in close proximity to each other and share an identical environment in a given column amp then process differentials across the IC will not affect the gain differences between individual column amplifiers as it does with implementations that use transconductance amplifiers for the gain element.

By creating a differential image signal 118, minimal additional noise is introduced via capacitive coupling when routing the differential image signal 118 across the integrated circuit to the differential A/D 220 or other analog processing before the differential A/D 220. Because of the design of the column amplifier circuit, requirements on the amplifier used in the column amplifier 230 are reduced as feedback reduces non-linearity and the circuit inherently removes the offset voltage on the amplifier.

Figure 7:
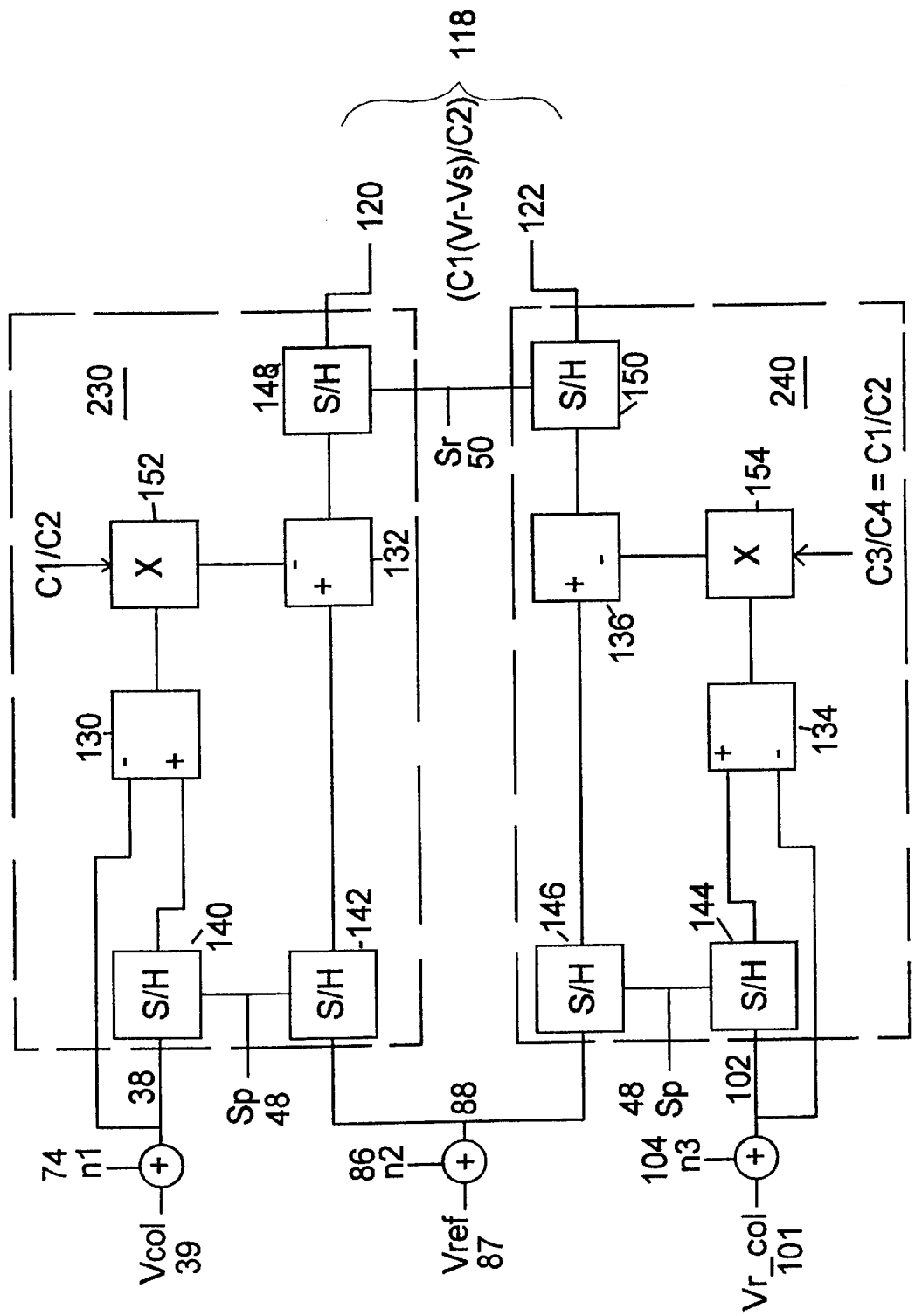
FIG. 7 illustrates in block diagram form the function of the column amplifier and reference amplifier of the circuit illustrated in FIG. 5.

FIG. 7 illustrates in block form the function provided by the circuits in FIG. 5 as a more general approach to implementing the invention. A first double sampling circuit (DS), comprised of column amplifier 230, receives an ideal image signal 39, Vcol, and a first noise component 74, n1, which together form the common column line image signal 38. This image signal 38 is coupled to a first sample hold circuit 140 and to a minus input of a first subtract circuit 130. The output of the first sample hold circuit 140 is coupled to the plus input of the first subtract circuit 130. The first sample hold circuit 140 is controlled by the sample pixel Sp signal 48. The output of the first subtract circuit 130 is coupled to a first amplifier 152 having a gain set by capacitor area ratios (C1/C2) and offset cancellation. The first DS circuit also receives an ideal voltage reference source 87 that has a second noise component 86, n2, added to it to form a voltage reference source 88. This voltage reference source 88 is coupled to a second sample hold circuit 142, which is controlled by the sample pixel Sp signal 48. The output of the second sample hold circuit 142 is coupled to the plus input of a second subtract circuit 132. The minus input of the second subtract circuit 132 receives the output of the first amplifier 152. The output of the second subtract circuit 132 is coupled to a third sample hold circuit 148, which is controlled by the sample reset Sr signal 50. The output of the third sample hold circuit 148 becomes the first side 120 of the difference image signal 118.

Likewise for the reference column, a second double sampling circuit (DS), comprised of reference column amplifier 240, receives an ideal reference signal 101, Vr_col, and a third noise component 104, n3, which together form the common reference column line signal 102. This reference column line signal 102 is coupled to a fourth sample hold circuit 144 and to a minus input of a third subtract circuit 134. The output of the fourth sample hold circuit 144 is coupled to the plus input of the third subtract circuit 134. The fourth sample hold circuit 144 is controlled by the sample pixel Sp signal 48. The output of the third subtract circuit 134 is coupled to a second amplifier 154 having a gain set by capacitor area ratios (C3/C4, preferably C3/C4=C1/C2) and offset cancellation. The second DS circuit also receives the ideal voltage reference source 87 that has a second noise component 86, n2, added to it to form a voltage reference source 88. This voltage reference source 88 is coupled to a fifth sample hold circuit 146, which is controlled by the sample pixel Sp signal 48. The output of the fifth sample hold circuit 146 is coupled to the plus input of a fourth subtract circuit 136. The minus input of the fourth subtract circuit 136 receives the output of the second amplifier 154. The output of the fourth subtract circuit 136 is coupled to a sixth sample hold circuit 150, which is controlled by the sample reset Sr signal 50. The output of the sixth sample hold circuit 150 becomes the second side 122 of the difference image signal 118. Those skilled in the art will appreciate that from this basic block diagram, several different implementations of the invention can be designed and still fall within the spirit and scope of the invention.

What is claimed is:

1. A pixel column sensor for creating a reduced noise differential image signal comprising:
   a first and a second double sampling (DS) circuit, each having a first and a second sample period;
   the first DS circuit having an input coupled to an image signal that is subject to a set of noise components, an output outputting a first side of the reduced noise differential image signal, and a reference input;
   the second DS circuit having an input coupled to a reference image signal that is held in a reset state and is subject to the set of noise components, an output outputting a second side of the reduced noise differential image signal, and a reference input;
   a reference voltage source coupled to the reference inputs of the first and second DS circuits; and
   wherein the reference voltage is sampled during the first sample time period in the first and second DS circuits.

2. A pixel column amplifier architecture for creating a reduced noise differential image signal, comprising:
   a first double sampling (DS) circuit having an input coupled to an image signal that is subject to a set of noise components, an output outputting a first side of the reduced noise differential image signal, and a reference input;
   a second DS circuit having an input coupled to a reference image signal that is subject to the set of noise components and is held in a reset state, an output outputting a second side of the reduced noise differential image signal, and a reference input;
   a reference voltage source coupled to the reference inputs of the first and second DS circuits; and
   wherein one of the first and second DS circuits further includes,
      a first sample hold circuit having an input coupled to the input of the one DS circuit, an output, and a control input,
      a first subtract circuit having a plus input coupled to the output of the first sample hold circuit, a minus input coupled to the input of the one DS circuit and the input of first sample hold circuit, and an output,
      an amplifier having offset cancellation, having an input coupled to the output of the first subtract circuit, an output, and a gain setting controlled by capacitor area ratios,
      a second sample hold circuit having an input coupled to the reference input of the one DS circuit, an output, and a control signal coupled to said control signal of first sample hold circuit,
      a second subtract circuit having a plus input coupled to the input of the second sample hold circuit, a minus input coupled to the output of said amplifier, and an output,
      a third sample hold circuit having an input coupled to the output of the second subtract circuit, an output coupled to said output of said one DS circuit, and a control signal,
      a first control signal coupled to said control inputs of first and second sample hold circuits, and
      a second control signal coupled to the control input of the third sample hold circuit.

3. A pixel column amplifier architecture for creating a reduced noise differential image signal, comprising:
   a first double sampling (DS) circuit having an input coupled to an image signal that is subject to a set of noise components, an output outputting a first side of the reduced noise differential image signal, and a reference input;
   a second DS circuit having an input coupled to a reference image signal that is subject to the set of noise components and is held in a reset state, an output outputting a second side of the reduced noise differential image signal, and a reference output; and
   a reference voltage source coupled to the reference inputs of the first and second DS circuits; and
   wherein one of the first and second DS circuits includes,
      a first, a second, a third, and a fourth switch, each having an input, a control input, and an output, a first storage element having a first node coupled to output of said first switch and a second node, an amplifier having an input coupled to the second node of the first storage element and the input of the second switch, an output coupled to the output of the second switch and the input of the third switch coupled to the output of the one DS circuit, and a gain setting, a second storage element having a first node coupled to the second node of the first storage element and the input of said amplifier and a second node connected to the inputs of the third and fourth switch, the fourth switch having an input coupled to the reference input of said one DS circuit;

a first control signal coupled to said control input of said first switch;

a second control signal coupled to said control inputs of the second and fourth switch; and a third control signal coupled to said control input of said third switch.

4. An imaging system for generating an essentially parasitic noise free differential image signal based on an image focused on the imaging system, comprising:

a plurality of active pixel sensors arranged in an array of rows and columns to form a sensor array, each active pixel sensor able to generate a voltage potential at a diffusion node corresponding to detected light intensity by said active pixel sensor or a reset signal, each active pixel sensor buffering said voltage potential present on the diffusion node from other signals generated external to said active pixel sensor;

a plurality of reference pixel sensors, arranged in an array of rows and at least one column, thereby forming at least one reference column signal, said reference pixel sensors essentially having the same configuration as said active pixel sensors but having a reference reset signal to generate a voltage potential at a diffusion node, each reference pixel sensor buffering said reset potential present on the diffusion node from other signals generated external to said reference pixel sensor;

a reference voltage source;

a plurality of active pixel column amplifier circuits, each respective amplifier circuit being connected to the respective active pixel sensors in a column forming a respective column signal, said respective column signal subject to a combination of noise sources, each active pixel column amplifier circuit further comprising, a first double sampling (DDS) circuit having an input, an output, and a reference input, said input of the first DS circuit coupled to said respective column signal, and said reference voltage source coupled to said reference input of each said first DS circuit;

at least one reference column amplifier circuit, said at least one reference column amplifier coupled to a respective said reference column signal held in a reset state, said respective reference column signal subject to a combination of noise sources as said respective active pixel columns, said respective reference column amplifier circuit further comprising, a second DS circuit having essentially the same configuration as said first DS circuit, said second DS circuit having an input, an output, and a reference input, said input of second DS circuit coupled to said respective reference column signal held in a reset state, and said reference input of each said second DS circuit coupled to said reference voltage source; and a timing controller coupled to each said active pixel column amplifier and each reference column amplifier circuits, wherein the timing controller activates said plurality of active pixel sensors to provide a voltage signal corresponding to a present frame to the active pixel column amplifier and to provide a non-reset signal to the activated reference pixel sensor to provide a voltage signal corresponding to a reset level to the respective reference column amplifier circuits, and then to provide a voltage signal corresponding to a reset signal to the active pixel column amplifier circuits and said non-reset signal to the reference column amplifier circuits, and wherein the timing controller enables the active pixel column amplifier circuits to sequentially provide each said column amplifier circuit output signal to a first common output line and wherein the timing controller enables the reference column amplifier output signal to a second common output line to generate the imaging system parasitic noise free differential signal.

5. The imaging system of claim 4, wherein said first DS circuit and said second DS circuit have a first sample time period and a second sample time period and said reference voltage is sampled during said first sample time period in both said first DS circuit and said second DS circuit.

6. The imaging system of claim 4, wherein said image signal and said reference signal are created on a single substrate.

7. The imaging system as in claim 4 further comprising a row decoder having a plurality of control lines connected to said sensor array, each control line being connected to said active pixel sensors in a respective column signal, wherein the row decoder is able to activate said active pixel sensors in a row, and said timing controller is coupled to said row controller wherein the timing controller activates each sensor row to be sequentially activated.

8. The imaging system as in claim 4 wherein each said first DS circuit and said second DS circuit further comprises:

a first sample hold circuit having an input, an output, a control input, said input coupled to said input of each respective DS circuit;

a first subtract circuit having a plus input, a minus input and an output, said minus input coupled to said input of each said respective DS circuit and said input of first sample hold circuit, said plus input coupled to said output of said first sample hold circuit;

an amplifier having offset cancellation, having an input, an output, and a gain setting, said gain setting controlled by capacitor area ratios, said input coupled to said output of first subtract circuit;

a second sample hold circuit having an input, an output, and a control signal, said input coupled to said reference input of each respective DS circuit, said control signal coupled to said control signal of said first sample hold circuit;

a second subtract circuit having a plus input, a minus input and an output, said plus input coupled to said output of said second sample hold circuit, said minus input coupled to said output of said amplifier;

a third sample hold circuit having an input, an output, an a control signal, said input coupled to said output of said second subtract circuit, said output coupled to said output of each respective DS circuit;

a first control signal coupled to said control inputs of first sample hold circuit and said second sample hold circuit of each respective DS circuit; and a second control signal coupled to said control input of said third sample hold circuit of each respective DS circuit.

9. The imaging system as in claim 4 wherein each said first DS circuit and said second DS circuit further comprises:
   a first switch having an input, a control input, and an output;
   a first storage element having a first node and a second node, said first node coupled to output of said first switch;
   an amplifier having an input, an output and a gain setting, said input coupled to said second node of said first storage element, said output coupled to output of each respective DS circuit;
   a second storage element having a first node and a second node, said first node coupled to said second node of first storage element and said input of said amplifier;
   a second switch having an input, a control input, and an output, said input coupled to said input of said amplifier, said output coupled to said output of said amplifier;
   a third switch having an input, a control input, and an output, said input coupled to said output of said amplifier, said input coupled to said second node of said second storage element; and
   a fourth switch having an input, a control input, and an output, said input coupled to said second node of said second storage element, said input coupled to said reference input of each respective DS circuit;
   a first control signal coupled to control input of said first switch of each respective DS circuit;
   a second control signal coupled to said control inputs of said second switch and said fourth switch of each respective DS circuit; and
   a third control signal coupled to said control input of said third switch of each respective DS circuit.

10. The imaging system of claim 4 wherein the timing controller, the row decoder, the active pixel column amplifiers, and the active pixel sensor array are a single device.

11. The imaging system of claim 4 wherein said plurality of reference pixel sensors further comprise having a shield to electromagnetic energy.

12. The imaging system of claim 11 wherein said shield further comprises an optical mask that is opaque.

13. The imaging system of claim 4 wherein said first common output line and said second common output line have essentially the same balanced loads.

14. A method for sampling a set of column outputs of a pixel sensor array to create a reduced noise differential image signal, comprising the steps of:
   sampling and storing a first column output of the set of column outputs, thereby creating a first sampled value;
   sampling said first column output of the set of column outputs, thereby creating a second sampled value;
   subtracting said first sampled value from said second sampled value, thereby creating a first image value;
   sampling and storing a voltage reference source, thereby creating a first sampled reference value;
   subtracting said first image value from said first sampled reference value, thereby creating a first difference image signal;
   holding a second column of the set of column outputs in a reset state;
   sampling and storing said second column of the set of column outputs thereby creating a third sampled value;
   sampling said second column of the set of column outputs, thereby creating a fourth sampled value;
   subtracting said third sampled value from said fourth sampled value, thereby creating a second image value;
   sampling and storing said voltage reference source, thereby creating a second sampled reference value; and
   subtracting said second image value from said second sampled reference value, thereby creating a second difference image signal.

15. A method for sampling an output of a pixel sensor array having a first phase, a second phase, and a third phase of operation, comprising the steps of:
   during the first phase:
      sampling and storing the output of said pixel sensor array, the output having a first noise component, thereby creating a stored sampled output of said PIXEL SENSOR array;
      sampling and storing a reference voltage source, which includes a second noise component, thereby creating a first stored reference voltage source;
      sampling and storing said reference voltage source, which includes said second noise component, thereby creating a second stored reference voltage source;
      sampling and storing a reference column output from said pixel sensor array, said reference column output held in a reset state, said reference column output having a third noise component essentially the same as said first noise component, thereby creating a stored reference column output;
   during the second phase:
      subtracting the output of said pixel sensor array from said stored sampled output of said pixel sensor array thereby creating a first subtracted signal;
      amplifing said first subtracted signal thereby creating a first amplified subtracted signal;
      subtracting said reference column output from said stored reference column output thereby creating a second subtracted signal;
      amplifying said second subtracted signal thereby creating a second subtracted signal;
      subtracting said first subtracted signal from said first stored reference voltage source thereby creating a third subtracted signal;
      subtracting said second subtracted signal from said second stored reference voltage source thereby creating a fourth subtracted signal;
      sampling and storing said third subtracted signal thereby creating a third stored subtracted signal;
      sampling and storing said fourth subtracted signal thereby creating a fourth stored subtracted signal; and
   during the third phase:
      subtracting said fourth stored subtracted signal from said third stored subtracted signal whereby an output signal is created that essentially does not contain said first noise component, said second noise component and said third noise component.

16. A method for sampling an output of a pixel sensor array to reduce extraneous noise components, said method having a first phase, a second phase, and a third phase, comprising the steps of:
   during the first phase:
      sampling and storing said output of said pixel sensor array, said output having a first noise component;

sampling and storing a reference column output held in a reset state from said pixel sensor array, said reference column output having a second noise component, said second noise component essentially the same magnitude as said first noise component;

sampling a reference voltage source, said reference voltage source having a third noise component;

storing twice said reference voltage source with said third noise source thereby creating a first stored reference voltage source and a second stored reference voltage source;

during the second phase:

sampling and subtracting from said stored output of said pixel sensor array a reset level from said output of said pixel sensor array, said reset level having a fourth noise component, thereby creating a first resultant value;

sampling and subtracting from said stored reference column output, said reference column output held in a reset state, said reference column output having a fifth noise component, said fifth noise component essentially the same magnitude as said fourth noise component, thereby creating a second resultant value;

subtracting from said first stored reference voltage source said first resultant value thereby creating a third resultant value;

subtracting from said second stored reference voltage source said second resultant value thereby creating a fourth resultant value; and during the third phase:

subtracting said fourth resultant value from said third resultant value thereby creating an image signal that represents said output of said pixel sensor array less said reset signal from said output of said pixel sensor array and essentially said first, second, third, fourth, and fifth noise sources are not present in said image signal.

* * * * *